(12) United States Patent
Takahashi

(10) Patent No.: US 7,491,982 B2
(45) Date of Patent: Feb. 17, 2009

(54) DIODE HAVING LOW FORWARD VOLTAGE DROP

(75) Inventor: Hideki Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 157 days.

(21) Appl. No.: 11/320,641

(22) Filed: Dec. 30, 2005

(65) Prior Publication Data

US 2006/0170075 A1  Aug. 3, 2006

(30) Foreign Application Priority Data

Jan. 28, 2005  (JP) .............................. 2005-021091

(51) Int. Cl.
*H01L 29/74* (2006.01)
(52) U.S. Cl. .............................. 257/170; 257/E29.013; 257/580
(58) Field of Classification Search ................. 257/164, 257/170, 580, E29.013, E29.328, 494, 121, 257/127
See application file for complete search history.

(56) References Cited

U.S. PATENT DOCUMENTS 6,177,713 B1  1/2001  Aono et al.

FOREIGN PATENT DOCUMENTS

| DE | 38 32 750 A1 | 3/1990 |
|---|---|---|
| EP | 0361319 | 4/1990 |
| JP | 7-14805 | 1/1995 |
| JP | 8-306937 | 11/1996 |
| JP | 3444082 | 6/2003 |
| JP | 2003-197898 | 7/2003 |
| JP | 2003197898 A * | 7/2003 |

* cited by examiner

*Primary Examiner*—Jerome Jackson, Jr.
*Assistant Examiner*—Jami M Valentine
(74) *Attorney, Agent, or Firm*—Oblon, Spivak, McClelland, Maier & Neustadt, P.C.

(57) ABSTRACT

A semiconductor device, including: a semiconductor substrate of the first conductivity type having a first surface and a second surface; a base region of the second conductivity type formed on the first surface of the semiconductor substrate; a guard ring region of the second conductivity type formed around the base region, and having the second type impurity of which concentration is lower than that of the base region; a first electrode formed on the base region; and a second electrode formed on the second surface of the semiconductor substrate, further including a base peripheral region formed around the base region and being connected to the base region, wherein the base peripheral region is deeper than the base region and has the substantially constant depth, and the concentration of the second conductivity type impurity included in the base peripheral region is lower than that included in the base region.

10 Claims, 6 Drawing Sheets

DIODE HAVING LOW FORWARD VOLTAGE DROP

BACKGROUND OF THE INVENTION

1. Field of the Invention

The present invention relates to a semiconductor device, and more particularly, to a diode having low forward voltage drop (Vf) and preventing recovery breakdown in case of reverse recovery.

2. Description of the Related Art

Recently, a converter bridge having a high power IGBT and a diode disposed in parallel is used for a converter circuit. In the diode, an $n^-$ semiconductor layer sandwiched between a p semiconductor layer as an anode and $n^+$ semiconductor layer as a cathode is designed to have long lifetime of carriers in order to decrease the forward voltage. In the event that the lifetime of carriers in the $n^-$ semiconductor layer is long like this, recovery current occurred when the diode is switched from the on-state to the off-state (recovery process) is increased. Hereby, there arises a problem that the diode is destroyed during the recovery process (recovery breakdown). Specially, the recovery breakdown is occurred at the peripheral part of the diode where minority carriers are concentrated.

In order to solve the above problem, the following ways are suggested. In the first way, an electron beam is locally irradiated to the peripheral part of the diode where the minority carriers are concentrated so that the lifetime of the carrier is controlled, hereby the breakdown of the diode is prevented (JP, 07-184085, A). In the second way, an anode electrode is disposed so that the edge of the electrode is separated inward from the edge of the p semiconductor layer of anode at the distance of the diffusion length of the minority carrier, hereby the concentration of the minority carriers at the edge of the p semiconductor layer of anode is prevented and the breakdown of the diode is prevented (JP, 3444082).

SUMMARY OF THE INVENTION

There are problems, however, that it is difficult to irradiate the electron beam locally to the peripheral part of the diode, and that this irradiation step makes the product process complicate. In the case that the edge of the anode electrode is formed away from the p semiconductor layer of anode, there arises a problem that the area of the anode electrode decreases and hereby the forward voltage drop (Vf) increases.

An object of the present invention is to provide a semiconductor device having low forward voltage drop (Vf), and preventing recovery breakdown without controlling lifetime of minority carriers.

The present invention is directed to a semiconductor device, including: a semiconductor substrate of the first conductivity type having a first surface and a second surface; a base region of the second conductivity type formed on the first surface of the semiconductor substrate; a guard ring region of the second conductivity type formed around the base region, and having the second type impurity of which concentration is lower than that of the base region; a first electrode formed on the base region; and a second electrode formed on the second surface of the semiconductor substrate, further including a base peripheral region formed around the base region and being connected to the base region, wherein the base peripheral region is deeper than the base region and has the substantially constant depth, and the concentration of the second conductivity type impurity included in the base peripheral region is lower than that included in the base region.

As described above, according to the semiconductor device of the present invention, it is possible to prevent the recovery breakdown without both of increasing the forward voltage drop and controlling the lifetime of the carriers.

DETAILED DESCRIPTION OF THE PREFERRED EMBODIMENTS

Embodiment 1

Figure 1:
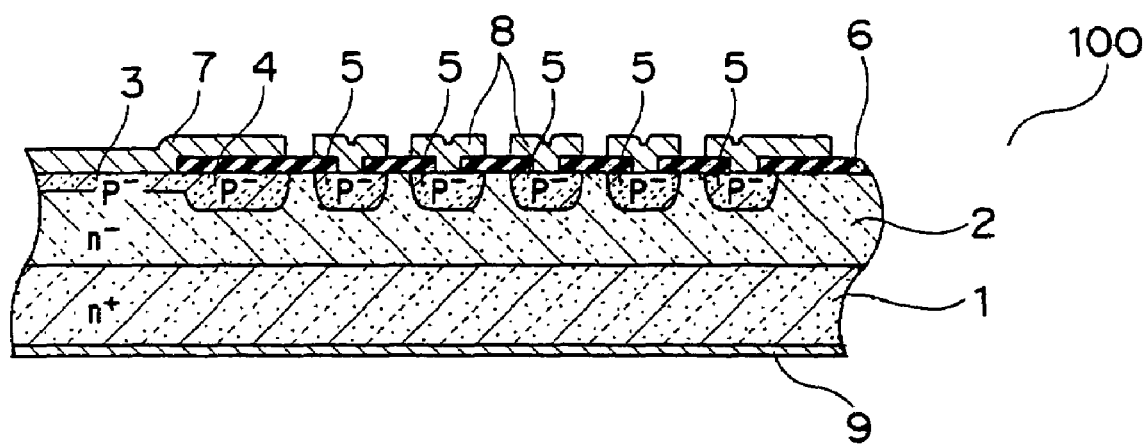
FIG. 1 shows a cross sectional view of the diode according to the embodiment 1 of the present invention.

FIG. 1 shows a sectional view of a diode according to the embodiment 1 of the present invention generally denoted at 100. The diode 100 includes an n-type semiconductor substrate 1 of silicon for instance. On the semiconductor substrate 1, an n-type $n^-$ semiconductor layer 2 is formed. On the front surface of the $n^-$ semiconductor layer 2, a p-type anode region (base region) 3 is formed.

Around the anode region 3, p-type anode peripheral region (base peripheral region) 4 connected to the anode region is formed. The concentration of the p-type impurity in the anode peripheral region 4 is less than that in the anode region 3. Further, the depth of the anode peripheral region 4 is more than that of the anode region 3. Also it is noted that, in the diode 100, the depth of the anode peripheral region 4 is substantially constant, and the bottom face of that is substantially flat.

Furthermore, a p-type guard ring region 5 is formed to surround the anode region 3. In FIG. 1, five tracks of p-type guard ring 5 are formed. The concentration of the p-type impurity in the guard ring region 5 is less than that in the anode region 3, and substantially equal to that in the anode peripheral region 4. The depth of the anode peripheral region 4 is more than that of the anode region 3, and substantially equal to that of the guard ring region 5.

An insulating film 6 of silicon oxide for instance is formed on the front surface of the $n^-$ semiconductor layer 2.

An anode electrode (first electrode) 7 of aluminum for instance is formed on the anode region 3, and a guard ring electrode 8 of aluminum for instance is formed on the guard ring region 5. While a cathode electrode (second electrode) 2 of aluminum for instance is formed on the rear surface of the semiconductor substrate 1.

In FIG. 1, only the partially sectional view of the diode 100 is shown. Actually, the anode peripheral region 4 is formed to surround the anode region 3, and the annular guard ring region 5 is formed outside of and to surround the anode region 3.

The diode 100 according to the embodiment 1, current flows between the anode electrode 7 and the cathode electrode 9 by injecting holes from the anode region 3 into the n⁻ semiconductor layer 2, when forward bias more than the given threshold voltage (anode voltage $V_{AK}$) is supplied between these electrodes 7 and 9. In the diode 100, the holes are able to move at an enough velocity, therefore, the forward voltage drop (Vf) is maintained at lower level.

On the other hand, a certain threshold voltage is maintained by extending the depletion layer from the anode peripheral region 4 and the guard ring region 5 as well as the anode region 3, when reverse bias (cathode voltage $V_{KA}$) is supplied.

Figure 2:
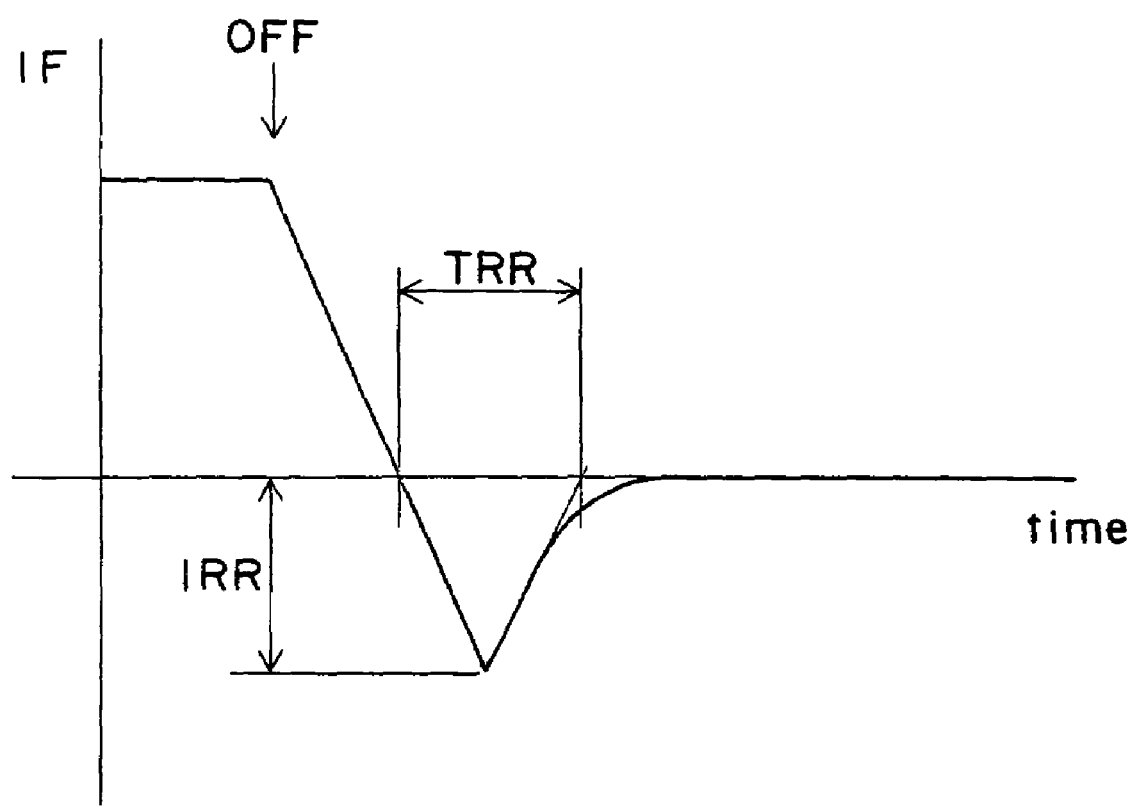
FIG. 2 shows a diagram showing the change of current in the case that the diode is switched from the on-state to the off-state.

FIG. 2 shows the change of the current (recovery action) when the diode is switched from the on-stage to the off-stage. As shown in FIG. 2, the current flows in the reverse direction for a while when the reverse voltage is supplied (off-stage) during the current flows in the forward direction (on-stage). The peak value of this current flowing in the reverse direction is called IRR. The value of the IRR depends on the time change of current (dI/dt) during the change of current direction from the forward direction to the reverse direction, and the value of the IRR increases as the value of the dI/dt increases. The recovery breakdown occurs at the time when the value of the IRR exceeds a certain value.

In the diode 100, at the state that the forward current is flowing (on-state), the holes flow into the n⁻ semiconductor layer 2 through the p-type anode region 3, when the holes flow from the anode electrode 7 to the n⁻ semiconductor layer 2. Simultaneously, around the anode region 3, the holes flow into the n⁻ semiconductor layer 2 through the anode peripheral region 4 adjoining to the anode region 3. As the holes pass through the anode peripheral region 4 which has lower concentration of the p-type impurity and larger depth than that of the anode region 3, the holes are injected and spread into the n⁻ semiconductor layer 2 in the depth direction while the injection of the holes into the n⁻ semiconductor layer 2 is controlled.

Next, when the diode 100 is switched from the on-state to the off-state, there are not excess holes at the periphery of the anode. It is because that in the anode region 3, the holes are injected to spread in the depth direction as described above, and that at the peripheral of the anode region 3, the injection of holes into the n⁻ semiconductor layer 2 is controlled by the anode region 3 and the anode peripheral region 4. Hereby, the recovery breakdown is prevented because the holes injected into the n⁻ semiconductor layer 2 are not localized and return to the anode electrode 7. Further, by using the deep anode peripheral region 4, a pass way through which the holes around the anode return to the anode electrode 7 is defined wider, thereby, the recovery breakdown is prevented.

As mentioned above, according the semiconductor device 100 of the Embodiment 1, the injection of the holes into the n⁻ semiconductor layer 2 is controlled at the on-state, and the pass way of the holes becomes wider at the off-state, thereby, the recovery breakdown is prevented.

Figure 3:
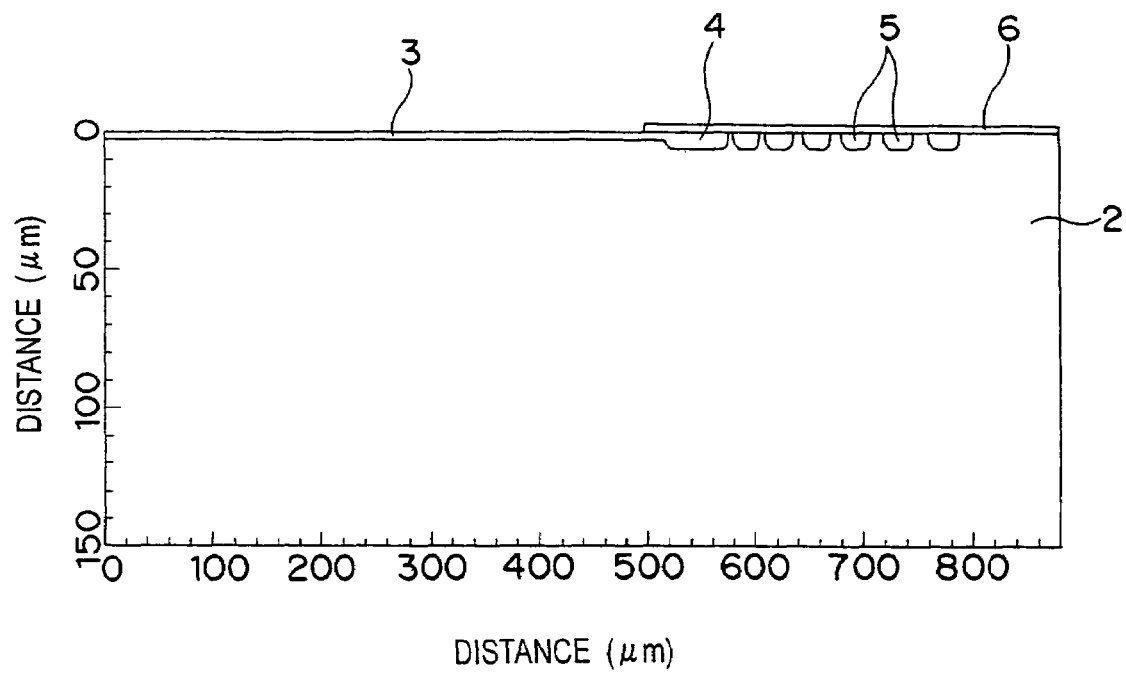
FIG. 3 shows a cross sectional view of the diode using for the simulation.

Next, as described later, the effect of preventing the recovery breakdown is verified by using simulation. FIG. 3 shows a cross sectional view of the diode using for the simulation. In FIG. 3, the numerals which are identical with those of FIG. 1 denote identical or corresponding components. Also, in FIG. 3, the insulating layer 6 is formed to cover the anode peripheral region 4 and the guard ring region 5 successively. The anode region (p layer) 3 disposed inside of the anode peripheral region 4 and the guard ring region 5 has a depth Xj of 3 μm and a p-type impurity concentration of $1\times10^{17}/cm^3$. While the anode peripheral region 4 and the guard ring region 5 disposed outside of the anode region 3 have a depth Xj of 6 μm respectively, and of which p-type impurity concentration varies in the range between $1\times10^{15}$ and $1\times10^{17}/cm^3$.

Figure 4:
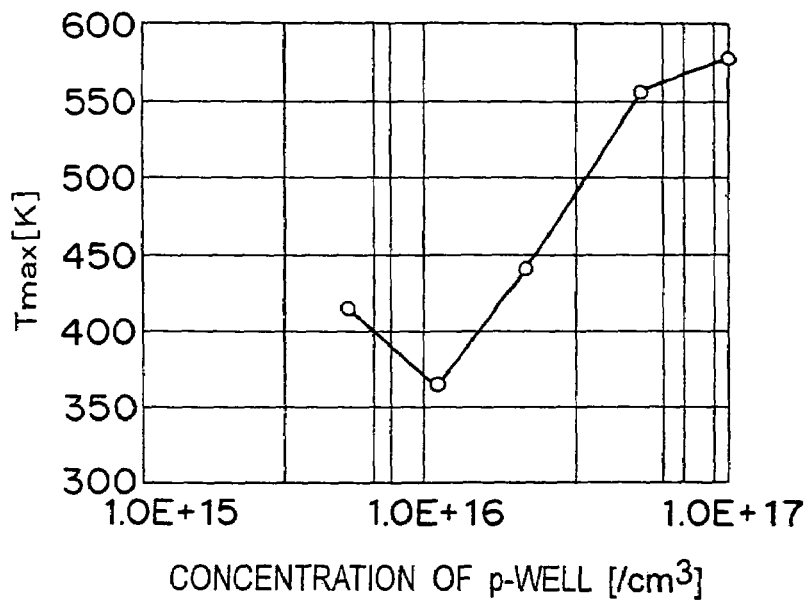
FIG. 4 shows a relation between the concentration of the p well and the temperature of the diode.
Figure 5:
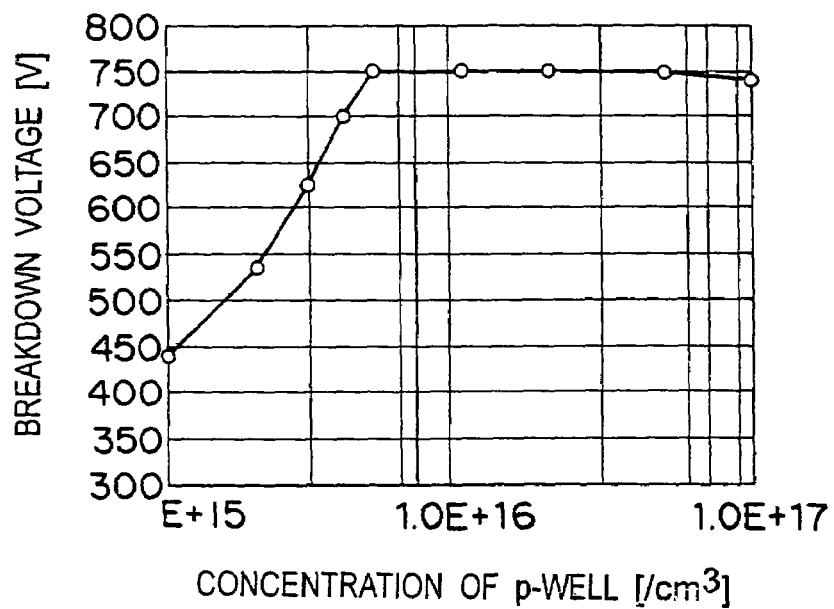
FIG. 5 shows a relation between the concentration of the p well and the breakdown voltage of the diode.

FIGS. 4 and 5 show a relation between the concentration of the p well and the temperature and the threshold voltage of the diode, in the recovery stage, which is used for the simulation. In the simulation, the initial temperature of the diode is set as 300° C.

In FIG. 4, the horizontal axis shows the concentration of the anode peripheral region 4 and the guard ring region 5 (p well), and the vertical axis shows the maximum temperature of the diode. As shown in FIG. 4, when the concentration of the p well decreases from $1\times10^{17}/cm^3$, the temperature of the diode falls. When the concentration of the p well reaches about $1\times10^{16}/cm^3$, the rise in temperature of the diode decreases to one fourth (370° C.−300° C.=70° C.) of that indicated when the concentration of the p well is $1\times10^{17}/cm^3$ (580° C.−300° C.=280° C.).

In FIG. 5, the horizontal axis shows the concentration of the anode peripheral region 4 and the guard ring region 5 (p well), and the vertical axis shows the breakdown voltage of the diode. As shown in FIG. 5, the breakdown voltage is substantially constant at 750V, when the concentration of the p well decreases from $1\times10^{17}/cm^3$ to $5\times10^{15}/cm^3$. When the concentration of the p well decreases further, the breakdown voltage also decreases.

FIGS. 4 and 5 show that the suitable concentration of the anode peripheral region 4 and the guard ring region 5 (p well) is about $1\times10^{16}/cm^3$ in order to decrease the rise in temperature of the diode and to increase the breakdown voltage of the diode during the recovery action.

Next, the producing method of the diode 100 according to the embodiment 1 is described by using FIG. 6. In FIG. 6, the numerals which are identical with those of FIG. 1 denote identical or corresponding components. The producing method includes the following steps 1 through 6.

Figure 6A:
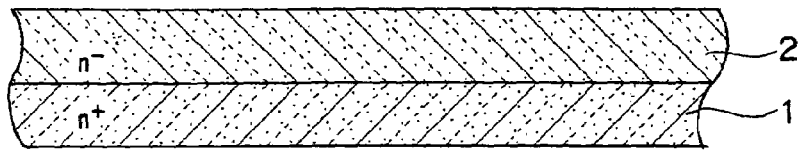
FIGS. 6A through 6F show cross sectional views of steps of manufacturing the diode according to the embodiment 1 of the present invention.

Step 1: As shown in FIG. 6A, the n-type semiconductor substrate (n⁺) 1 of silicon for instance is prepared. The n-type semiconductor layer (n⁻) 2 is formed on it. It is noted that a semiconductor substrate having an n⁺ semiconductor layer and an n⁻ semiconductor layer can be prepared.

Figure 6B:
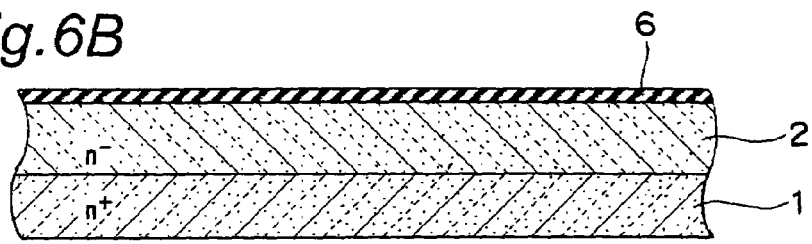

Step 2: As shown in FIG. 6B, the oxide film 6 of silicon oxide for instance is formed on the n-type semiconductor layer 2.

Figure 6C:
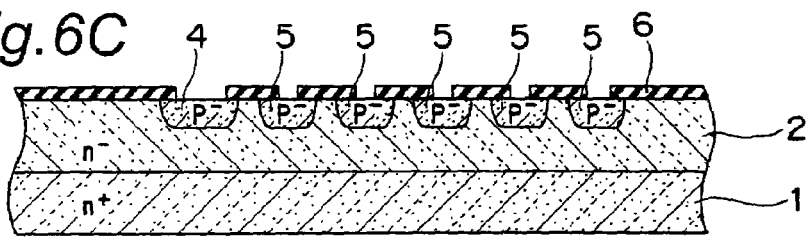

Step 3: As shown in FIG. 6C, after patterning the oxide film 6, the p-type anode peripheral region (p⁻) 4 and the p-type guard ring region (p⁻) (p well) are formed by using the oxide film 6 as a mask. The concentration of the p-type impurity in the regions 4 and 5 is about $5\times10^{15}/cm^3$ through about $3\times10^{16}/cm^3$ for instance, and preferably $3\times10^{16}/cm^3$. An ion implantation technique and an annealing technique are used for forming the anode peripheral region 4 and the guard ring region 5. These regions 4 and 5 are formed to have substantially flat bottom faces respectively.

Figure 6D:
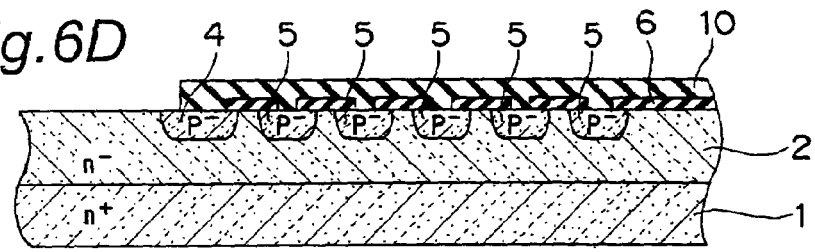

Step 4: As shown in FIG. 6D, a resist mask 10 is formed to cover the guard ring region 5.

Figure 6E:
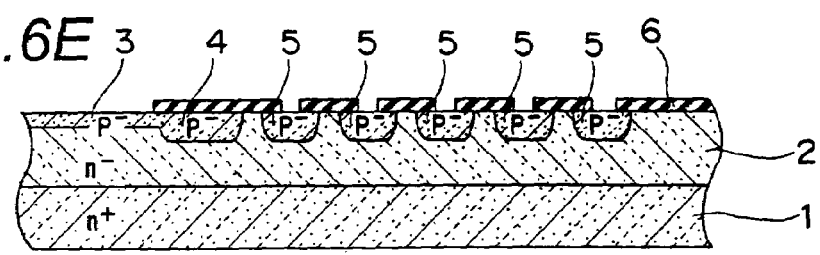

Step 5: As shown in FIG. 6E, the anode region 3 is formed by using the resist mask 10. The concentration of the p-type impurity in the anode region 3 is about $1\times10^{17}/cm^3$ for instance. Thus the concentration of the p-type impurity in the anode region 3 is not less than five times of that in the anode peripheral region 4 and the guard ring region 5. Also the depth of the anode region 3 is not greater than half of that of the anode peripheral region 4 and the guard ring region 5.

Figure 6F:
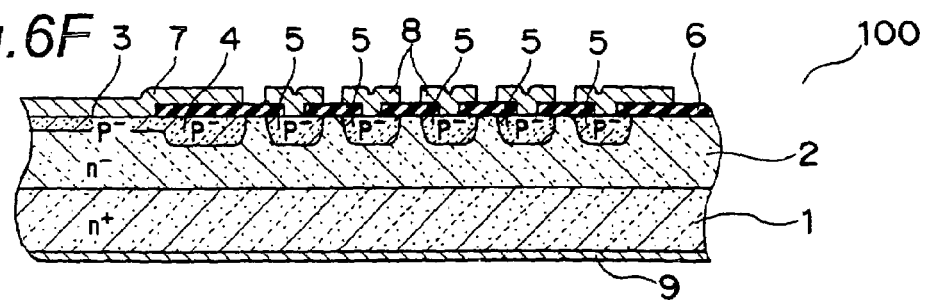

Step 6: As shown in FIG. 6F, an aluminum layer for instance is formed by using a vapor deposition on the whole surface, then the aluminum layer is patterned to form the anode electrode.7 and the guard ring electrode 8. Further, the cathode electrode 9 of aluminum for instance is formed on the bottom surface of the semiconductor substrate 1. Through these steps, the diode 100 according to the embodiment 1 of the present invention is completed.

Embodiment 2

Figure 7:
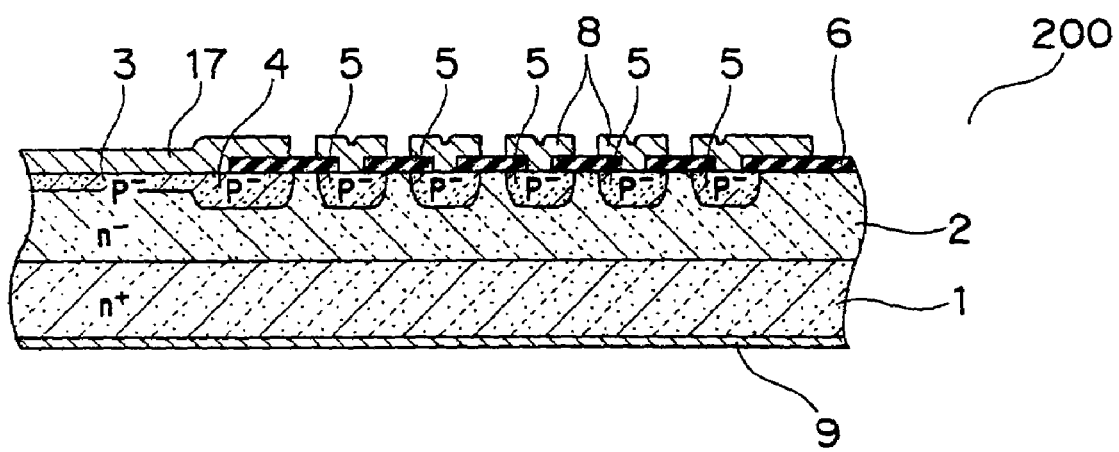
FIG. 7 shows a cross sectional view of the diode according to the embodiment 2 of the present invention.

FIG. 7 shows a sectional view of a diode according to the embodiment 2 of the present invention generally denoted at 200. In FIG. 7, the numerals which are identical with those of FIG. 1 denote identical or corresponding components. In the diode 200, the oxide film 6 covers the right half of the anode peripheral region 4, on the other hand, in the diode 100, the oxide film 6 covers the all of the anode peripheral region 4. This is the difference between the diodes 100 and 200, and hereby, the diode 200 has the structure including the cathode electrode 17 which extends over the anode peripheral region 4. The other components of the diode 200 are substantially the same as those of the diode 100.

The concentration of the p-type impurity of the anode peripheral region 4 is lower than that of the cathode region 3 (Namely, the value of the resistance of the anode peripheral region 4 is higher than that of the cathode region 3). Hereby the injunction of holes into the semiconductor layer 2 surrounding the anode peripheral region 4 is prevented, even if the cathode electrode 17 extends over the anode peripheral region 4 and is directly connected to that. Consequently, the holes which cause the recovery breakdown decrease during the recovery action, so that the recovery breakdown is prevented.

Also, the area of the connecting portion between the anode peripheral region 4 and the cathode electrode 17 becomes larger, hereby the forward drop voltage (Vf) can be made smaller.

Further, the recovery breakdown or the like do not occur even if the cathode electrode 17 is formed to cover the anode peripheral region 4, hereby design margin can be enlarged.

It is noted that the p-type and the n-type of the semiconductor can be exchanged mutually in Embodiments 1 and 2.

What is claimed is:

1. A semiconductor device, comprising:
   a semiconductor substrate of the first conductivity type having a first surface and a second surface;
   a base region of the second conductivity type formed on the first surface of the semiconductor substrate;
   a guard ring region of the second conductivity type forming an encircling structure laterally surrounding the base region, and having a second conductivity type impurity of which concentration is lower than that of the base region;
   a first electrode formed on the base region;
   a second electrode formed on the second surface of the semiconductor substrate;
   a base peripheral region forming an encircling structure laterally surrounding the base region and being connected to the base region, wherein the base peripheral region is deeper than the base region and has the substantially constant depth, and the concentration of the second conductivity type impurity included in the base peripheral region is lower than that included in the base region; and
   an insulating layer covering at least a portion of an upper surface of the base peripheral region, the insulating layer interposed between the base peripheral region and at least a portion of the first electrode.

2. The semiconductor device according to claim 1, wherein the concentration of the second conductivity type impurity included in the base peripheral region is substantially the same as that included in the guard ring region.

3. The semiconductor device according to claim 1, wherein the depth of the base peripheral region is substantially the same as that of the guard ring region.

4. The semiconductor device according to claim 1, wherein the first electrode is connected only to the base region inside of the connection part between the base region and the base peripheral region.

5. The semiconductor device according to claim 1, wherein the first electrode extends over the connection part between the base region and the base peripheral region, and is connected to both of the base region and the base peripheral region.

6. The semiconductor device according to claim 1, wherein the concentration of the second conductive type impurity included in the base region is not less than five times of that included in the base peripheral region.

7. The semiconductor device according to claim 1, wherein the concentration of the second conductive type impurity included in the base peripheral region ranges from about $5 \times 10^{15}$ to about $3 \times 10^{16}$/cm$^3$.

8. The semiconductor device according to claim 1, wherein the thickness of the base region is not greater than about half of that of the base peripheral region.

9. The semiconductor device according to claim 1, wherein the insulating layer covers a portion of an upper surface of the guard ring region.

10. The semiconductor device according to claim 9, wherein the insulating layer covers a region of the first surface of the semiconductor substrate that is located between the guard ring region and the base peripheral region.

* * * * *